United States Patent
DiJaili et al.

(10) Patent No.: US 6,943,939 B1
(45) Date of Patent: Sep. 13, 2005

(54) OPTICAL AMPLIFIER WITH DAMPED RELAXATION OSCILLATION

(75) Inventors: Sol P. DiJaili, Moraga, CA (US); Peter W. Evans, Tracy, CA (US)

(73) Assignee: Finisar Corporation, Sunnyvale, CA (US)

( * ) Notice: Subject to any disclaimer, the term of this patent is extended or adjusted under 35 U.S.C. 154(b) by 124 days.

(21) Appl. No.: 10/101,761

(22) Filed: Mar. 19, 2002

(51) Int. Cl.$^7$ .............................................. H01S 3/00
(52) U.S. Cl. ..................................................... 359/344
(58) Field of Search ......................... 359/344; 372/43, 372/47

(56) References Cited

U.S. PATENT DOCUMENTS

| | | | |
|---|---|---|---|
| 3,467,906 A | 9/1969 | Cornely et al. ............... 330/4.3 |
| 3,828,231 A | 8/1974 | Yamamoto .................... 357/30 |
| 4,794,346 A | 12/1988 | Miller .......................... 330/4.3 |
| 5,088,095 A | * 2/1992 | Zirngibl ........................... 372/6 |
| 5,119,039 A | * 6/1992 | Olshansky et al. .......... 359/346 |
| 5,239,607 A | * 8/1993 | da Silva et al. ............. 385/122 |
| 5,299,054 A | 3/1994 | Geiger ......................... 359/251 |
| 5,305,412 A | 4/1994 | Paoli ........................... 385/122 |
| 5,436,759 A | 7/1995 | Dijaili et al. ................ 359/333 |
| 5,604,628 A | 2/1997 | Parker et al. ................ 359/344 |
| 5,754,571 A | 5/1998 | Endoh et al. .................. 372/20 |
| 5,771,320 A | 6/1998 | Stone ............................ 385/16 |
| 5,778,132 A | 7/1998 | Csipkes et al. .............. 385/135 |
| 5,805,322 A | 9/1998 | Tomofuji ..................... 359/177 |
| 5,861,981 A | * 1/1999 | Jabr .......................... 359/337.1 |
| 5,999,293 A | 12/1999 | Manning ...................... 359/139 |
| 6,008,932 A | * 12/1999 | Luo et al. .................... 359/337 |
| 6,026,108 A | * 2/2000 | Lim et al. ...................... 372/50 |
| 6,061,156 A | 5/2000 | Takeshita et al. ............ 359/117 |
| 6,115,517 A | 9/2000 | Shiragaki et al. ............. 385/24 |
| 6,128,115 A | 10/2000 | Shiragaki .................... 359/128 |
| 6,317,531 B1 | 11/2001 | Chen et al. .................... 385/17 |
| 6,333,799 B1 | 12/2001 | Bala et al. ................... 359/128 |
| 6,335,992 B1 | 1/2002 | Bala et al. ..................... 385/17 |
| 6,421,170 B1 | * 7/2002 | Krol et al. ................ 359/337.1 |
| 6,590,701 B2 | * 7/2003 | Sugawara .................... 359/344 |
| 6,697,405 B2 | * 2/2004 | Kitatani et al. ............... 372/45 |
| 2002/0172458 A1 | * 11/2002 | Downie ........................ 385/31 |
| 2003/0067677 A1 | * 4/2003 | Islam et al. .................. 359/344 |

FOREIGN PATENT DOCUMENTS

| | | | |
|---|---|---|---|
| JP | 56006492 | 1/1981 | ............. H01S/3/18 |
| JP | 20030461860 A | * 2/2003 | ......... H01S/5/0683 |

OTHER PUBLICATIONS

Mutalik et al. Analog performance of 1310–nm gain–clamped semiconductor optical amplifiers. Optical Fiber Communication. OFC 97. Feb. 16, 1997–Feb. 21, 1997, pp. 266–267.*

(Continued)

*Primary Examiner*—Thomas H. Tarcza
*Assistant Examiner*—Deandra M. Hughes
(74) *Attorney, Agent, or Firm*—Workman Nydegger

(57) ABSTRACT

An optical amplifier with damped relaxation oscillation. A large distance between mirrors in a VLSOA increases damping for the relaxation oscillation. Alternatively, a feedback loop damps out relaxation oscillations.

22 Claims, 11 Drawing Sheets

OTHER PUBLICATIONS

Doussiere et al. Clamped Grain Travelling Wave Semiconductor Optical Amplifier for Wavelength Division Multiplexing Applications. Semiconductor Laser Conference, 1994. Sep. 19, 1994–Sep. 23, 1994, pp. 185–186.*

Pleumeekers et al. Relaxation Oscillations in the Gain Recovery of Gain–Clamped Semiconductor Optical Amplifiers: Simulatio and Experiments. OSA TOPS vol. 16 Optical Amplifiers and their Applicaiotns. 1997. pp. 260–264.*

Alcatel, "Alcatel Optronics Introduces a Gain–Clamped Semiconductor Optical Amplifier," *Press Release for Immediate Publication*, OFC '98, San Jose, 1 unnumbered page, (Feb. 1998).

Diez, S., Ludwig, R., and Weber, H.G., "All–Optical Switch for TDM and WDM/TDM Systems Demonstrated in a 640 Gbit/s Demultiplexing Experiment," Electronics Letters, vol. 34, No. 8, pp. 803–805, Apr. 16, 1988.

Diez, S., Ludwig, R., and Weber, H.G., Gain–Transparent SOA–Switch for High–Bitrate OTDM Add/Drop Multiplexing, IEEE Photonics Technology Letters, vol. 11, No. 1, pp. 60–62, Jan. 1999.

Diez, S., Ludwig, R., Patzak, E., and Weber, H.G., "Novel Gain–Transparent SOA–Switch for High Bitrate OTDM Add/Drop Multiplexing," ECOC'98, vol. 1, pp. 461–462, Sep. 1998.

Dorgeuille, F., Noirie, L., Faure, J–P., Ambrosy, A., Rabaron, S., Boubal, F., Schilling, M., and Artigue, C., "1.28 Tbit/s Throughput 8×8 Optical Switch Based on Arrays of Gain–Clamped Semiconductor Optical Amplifier Gates," Optical Fiber Communication Conference, vol. 4, pp. 221–223, Mar. 2000.

Dorgeuille, F., Lavigne, B., Emery, J.Y., Di Maggio, M., Le Bris, J., Chiaroni, D., Renaud, M., Baucknecht, R., Schneibel, H.P., Graf, C., and Melchior, H., "Fast Optical Amplifier Gate Array for WDM Routing and Switching Applications," OFC '98 Technical Digest, pp. 42–44, 1998.

Doussiere, P., Jourdan, A., Soulage, G., Garabédian, P., Graver, C., Fillion, T., Derouin, E, and Leclerc, D., "Clamped Gain Travelling Wave Semiconductor Optical Amplifier for Wavelength Division Multiplexing Application," IEEE, US, vol. Conf. 14, pp. 185–186, New York, Sep. 14, 1994.

Evankow, Jr., J.D., and Thompson, R.A., "Photonic Switching Modules Designed with Laser Diode Amplifiers," IEEE, Journal of Selected Areas in Communications, vol. 6, No 7, pp. 1087–1095, Aug. 1988.

Fernier, B., Brosson, P., Bayart, D., Doussière, P., Beaumont, R., Leblond, F., Morin, P., Da Loura, G., Jacquet, J., Derouin, E., and Garabedian, P., "Fast (300 ps) Polarization Insensitive Semiconductor Optical Amplifier Switch with Low Driving Current (70 mA)," Semiconductor Laser Conference, Conference Digest, 13th International, pp. 130–131, Sep. 21–25, 1992.

Fouquet, J.E., Venkatesh, S., Troll, M., Chen, D., Schiaffino, S., and Barth, P.W., "Compact, Scalable Fiber Optic Cross–Connect Switches," IEEE, 1999 Digest of the LEOS Summer Topical Meetings, pp. 59–60, 1999.

Ibrahim, M.M., "Photonic Switch Using Surface–Emitting Laser Diode and APD," 16th National Radio Science Conference, NRSC'99, pp. 1–8, Ain Shams University, Cairo, Egypt, Feb. 23–25, 1999.

Jeong, G., and Goodman, J.W., "Gain Optimization in Switches Based on Semiconductor Optical Amplifiers," Journal of Lightwave Technology, Vo. 13, No. 4, pp. 598–605, Apr. 1995.

Kitamura, S., Hatakeyama, H., and Hamamoto, K., "Spot–Size Converter Integrated Semiconductor Optical Amplifiers for Optical Gate Applications," IEEE Journal of Quantum Electronics, vol. 35, No. 7, pp. 1067–1074, Jul. 1999.

Leuthold, J., Besse, P.A., Eckner, J., Gamper, E., Dülk, M., and Melchior, H., "All–Optical Space Switches with Gain and Principally Ideal Extinction Ratios," IEEE Journal of Quantum Electronics, vol. 34, No. 4, pp. 622–633, Apr. 1998.

McAdams, L.R., Weverka, R,T., and Cloonan, J., "Linearizing High Performance Semiconductor Optical Amplifiers: Techniques and Performance," LEOS Presentation, pp. 363–364, 1996.

Mørk, J., and Mecozzi, A., "Semiconductor Devices for All–Optical Signal Processing: Just How Fast Can They Go?," IEEE Lasers and Electro–Optics Society 1999 12th Annual Meeting, LEOS'99, vol. 2, pp. 900–901, Nov. 8–11, 1999.

Mutalik, V. G., van den Hoven, G., and Tiemeijer, L., "Analog Performance of 1310–nm Gain–Clamped Semiconductor Optical Amplifiers," OfC '97 Technical Digest, pp. 266–267, 1997.

Panajotov, K., Ryvkin, B., Peeters, M., Verschaffelt, G., Danckaert, J., Thienpont, H., Veretennicoff, I., "Polarisation Switching in Proton–Implanted VCSELs," 1999 Digest of the LEOS Summer Topical Meetings, pp. 55–56, Jul. 26–30, 1999.

Qui, B.C., Ke, M.L., Kowalski, O.P., Bryce, A.C., Aitchison, J.S., Marsh, J.H., Owen, M., White, I.H., and Penty, R.V., "Monolithically Integrated Fabrication of 2×2 and 4×4 Crosspoint Switches Using Quantum Well Intermixing," 2000 International Conference on Indium Phosphide and Related Materials, Conference Proceedings, pp. 415–418, May 14–18, 2000.

Scheuer, J., Arbel, D., and Orenstein, M., "Nonlinear On–Switching of High Spatial Frequency Patterns in Ring Vertical Cavity Surface Emitting Lasers," 1999 IEEE LEOS Annual Meeting Conference Proceedings, 12th Annual Meeting, IEEE Lasers and Electro–Optics Society 1999 Annual Meeting, vol. 1, pp. 123–124, Nov. 8–9, 1999.

Soto, H., Erasme, D., and Guekos, G., "All–Optical Switch Demonstration Using a Birefringence Effect in a Semiconductor Optical Amplifier," IEEE CLEO, Pacific Rim '99, pp. 888–889, 1999.

Tai, C., and Way, W.I., "Dynamic Range and Switching Speed Limitations of an $N \times N$ Optical Packet Switch Based on Low–Gain Semiconductor Optical Amplifiers," IEEE Journal of Lightwave Technology, vol. 14, No. 4, pp. 525–533, Apr. 4, 1996.

Tiemeijer, L.F., Walczyk, S., Verboven, A.J.M., van den Hoven, G.N., Thijs, P.J.A., van Dongen, T., Binsma, J.J.M., and Jansen, E.J., "High–Gain 1310 nm Semiconductor Optical Amplifier Modules with a Built–in Amplified Signal Monitor for Optical Gain Control," IEEE Photonics Technology Letters, vol. 9, No. 3, pp. 309–311, Mar. 1997.

Toptchiyski , G., Kindt, S., and Petermann, K., "Time–Domain Modeling of Semiconductor Optical Amplifiers for OTDM Applications," IEEE Journal of Lightwave Technolog, vol. 17, No. 12, pp. 2577–2583, Dec. 1999.

Tiemeijer, L.F., Thijs, P.J.A., Dongen, T.v., Binsma, J.J.M., Jansen, E.J., van Helleputte, H.R.J.R., "Reduced Intermodulation Distortion in 1300 nm Gain–Clamped MQW Laser Amplifiers," IEEE Photonics Technology Letters, vol. 7, No. 3, pp. 284–286, Mar. 1995.

van Roijen, R., van der Heijden, M.M., Tiemeijer, L.F., Thijs, P.J.A., van Dongen, T., Binsma, J.J.M., and Verbeek, B.H., "Over 15 dB Gain from a Monolithically Integrated Optical Switch with an Amplifier," IEEE Photonics Technology Letters, vol. 5, No. 5, pp. 529–531, May 1993.

Yoshimoto, N., Magarl, K., Ito, T., Kawaguchi, Y., Kishi, K., Kondo, Y., Kadota, Y., Mitomi, O., Yoshikuni, Y., Hasumi, Y., Tohmori, Y., and Nakajima O., "Spot–Size Converted Polarization–Insensitive SOA Gate with a Vertical Tapered Submicrometer Stripe Structure," IEEE Photonics Technology Letters, vol. 10, No. 4, pp. 510–512, Apr. 4, 1998.

Walker, J.D., et al., "A Gain–Clamped, Crosstalk Free, Vertical Cavity Lasing Semiconductor Optical Amplifier for WDM Applications," Summaries of the papers presented at the topical meeting, Integrated Photonics Search; 1996 Technical Digest Series; Proceedings of Integrated Photonics; Boston, MA, 29.04–02.05 1996, vol. 6, pp. 474–477, 1996.

* cited by examiner

OPTICAL AMPLIFIER WITH DAMPED RELAXATION OSCILLATION

BACKGROUND

1. Field of the Invention

This invention relates to optical communications systems, in particular, to relaxation oscillation. Still more particularly, the present invention relates to optical amplifiers with damped relaxation oscillation.

2. Background of the Invention

Optical amplifiers, which boost the power of optical signals, are a basic building block for many types of optical systems. For example, fiber optic communications systems transmit information optically at very high speeds over optical fibers. A typical communications system includes a transmitter, an optical fiber, and a receiver. The transmitter incorporates information to be communicated into an optical signal and transmits the optical signal via the optical fiber to the receiver. The receiver recovers the original information from the received optical signal. In these systems, phenomena such as fiber losses, losses due to insertion of components in the transmission path, and splitting of the optical signal may attenuate the optical signal and degrade the corresponding signal-to-noise ratio as the optical signal propagates through the communications system. Optical amplifiers are used to compensate for these attenuations. As another example, receivers typically operate properly only within a relatively narrow range of optical signal power levels; optical amplifiers are used to boost an optical signal to the proper power range for the receiver.

An optical amplifier is used to apply a gain to an optical signal. This gain is measured by the power of the signal leaving the amplifier divided by the power of the signal entering the signal. Therefore, if the signal's gain through an amplifier is greater than one, then the amplifier has amplified (i.e., increased the signal's power) the signal. For an optical amplifer to function correctly in a system, it is desirable for the optical amplifier to have a known and stable gain. If the optical amplifier's gain is not stable and known, it is difficult to design and build optical systems that function well. Thus, it is desirable to have an optical amplifier with a stable gain.

Relaxation oscillation results from interplay between the laser field intensity in the resonator and the atomic inversion. An increase in the field intensity causes a reduction in the inversion due to the increased rate of stimulated transitions. This causes a reduction in the gain, which in turn tends to decrease the field intensity. Since relaxation oscillation affects the gain, relaxation oscillation acts to remove stability from the gain of an optical amplifier. Thus, to provide stable gain, it is desirable to damp the relaxation oscillation.

SUMMARY OF THE INVENTION

The present invention has damped relaxation oscillations in a lasing optical amplifier. This leads to a more stable gain for the amplifier.

One embodiment is an optical amplifier having a ratio of a relaxation oscillation frequency (radial) squared to damping coefficient of less than $1 \times 10^{10}$ rad/sec.

In a second embodiment, the optical amplifier is a vertically lasing semiconductor optical amplifier (a VLSOA). The VLSOA includes a laser cavity between two reflectors. The distance between the reflectors of the VLSOA is larger than the wavelength of the laser light traveling between the mirrors. This large distance provides more damping.

In a third embodiment, a feedback loop connected to an optical amplifier increases the damping of the optical amplifier by removing oscillations in the level of photon density. The feedback loop detects the relaxation oscillations. In response, the feedback loop provides a feedback signal that reduces "troughs" in the oscillations. This damps out the relaxation oscillations.

DETAILED DESCRIPTION OF THE PREFERRED EMBODIMENTS

The invention is directed to damping relaxation oscillations in optical amplifiers. Fluctuations in the gain of an optical amplifier can occur at the relaxation oscillation frequency of an optical amplifier. By damping the relaxation oscillations, gain fluctuations are reduced. Thus, damping the relaxation oscillations improves the gain performance of an optical amplifier.

Introduction: Basic Theory:

What follows is a brief description of one mathematical model of relaxation oscillation, damping, and gain perturbation.

Figure 1:
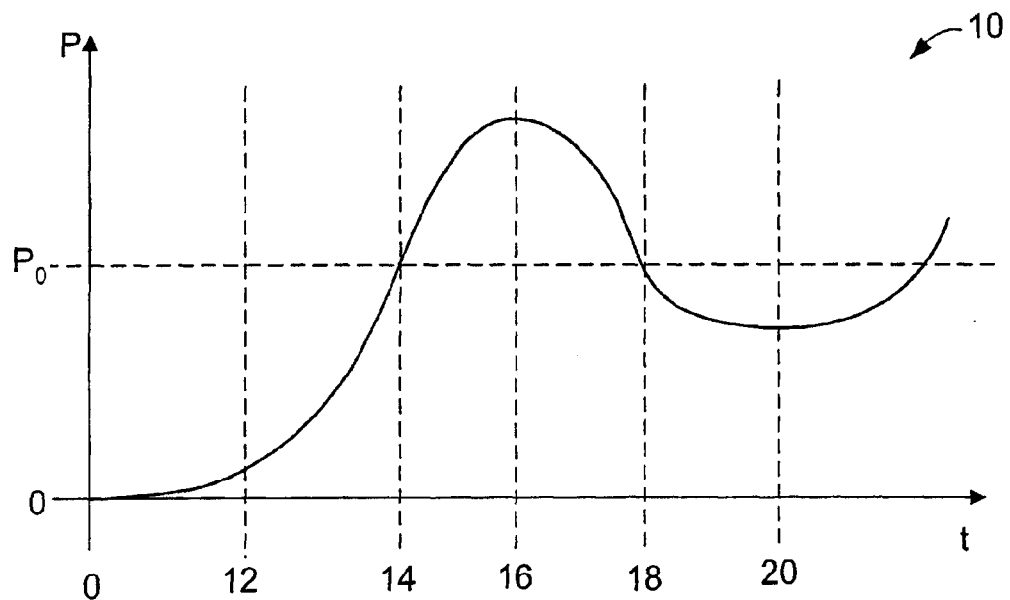
FIG. 1 is a graph of the photon density, P, in relation to time after the input of a step pump input.
Figure 2:
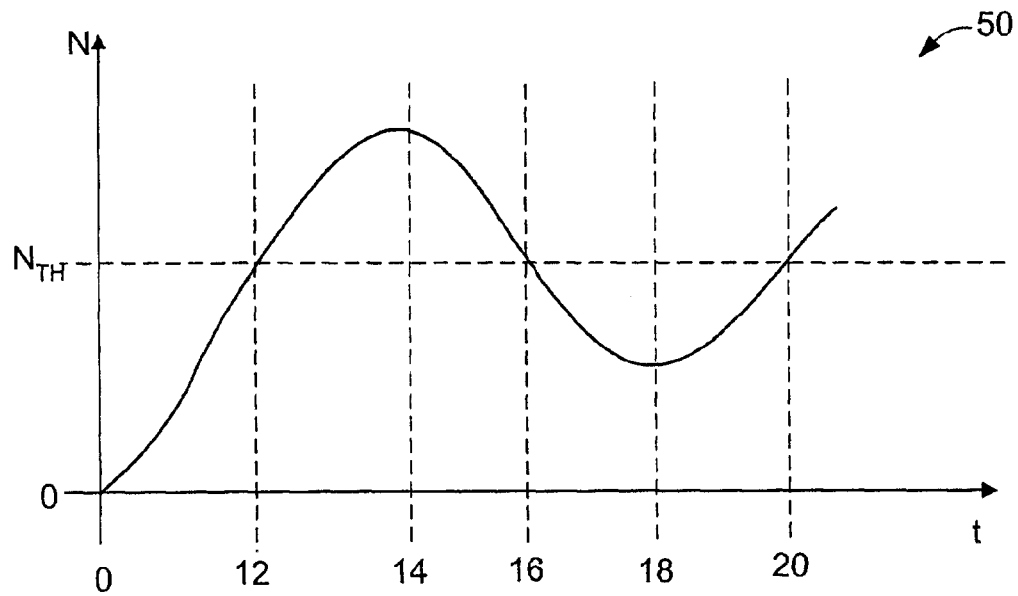
FIG. 2 is a graph of the carrier density, N, in relation to time after the input of the step pump input.

Relaxation oscillation can be understood with respect to a semiconductor laser using the following equations and the graphs in FIGS. 1 and 2.

The following equation describes the change in carrier density, N, as time changes:

$$\frac{dN}{dt} = \frac{J}{ed} - A(N - N_0)P - \frac{N}{\tau_N} \qquad (1)$$

The following equation describes the change in photon density of the lasing field, P, as time changes:

$$\frac{dP}{dt} = \Gamma A(N - N_0)P - \frac{P}{\tau_P} + \beta \frac{N}{\tau_N} \qquad (2)$$

In equations (1) and (2), J is the pumping current, e is the electron charge, $1.6 \times 10^{-19}$ coulombs, d is the active region thickness, A is the temporal differential gain, $N_0$ is the transparency, $\tau_N$ is the carrier lifetime (typically approximately 1 nanosecond), $\tau_p$ is the photon $$\beta \frac{N}{\tau_N}$$

is the spontaneous emission coupled into the lasing mode, and Γ is the area of the active region divided by the area of the mode or confinement factor. It is clear from the common terms in equations (1) and (2) that they are a pair of coupled differential equations, and in their linearized form (due to small perturbations) can be shown to describe a damped simple harmonic oscillator.

FIG. 1 is a graph 10 of the photon density, P, in relation to time after the input of a step function pump input, J at time t=0. FIG. 2 is a graph 50 of the carrier density, N, in relation to time after the input of the step pump input. Together, these graphs 10 and 50 illustrate how the actions of N and P are coupled together as defined by equations (1) and (2), and the relaxation oscillation of the semiconductor laser.

At first, both N and P are at zero. When the step input J is applied at time zero, both N and P start to rise. At time 12, N reaches a threshold density $N_{TH}$ and P begins to rise rapidly. At time 14, N reaches its maximum and the rate of P's increase also reaches its maximum. At time 16, the rate of N's decrease reaches its maximum and P reaches its maximum. At time 18, N reaches its minimum, and the rate of P's decrease reaches its maximum. At time 20, N's rate of increase again reaches its maximum and P reaches its minimum. Over time, the oscillations are damped out and N and P converge to $P_0$ and $N_{TH}$, respectively.

As seen from the graphs 10 and 50 and equations (1) and (2), N and P are ninety degrees out of phase. When N is at maximum, the rate of change of P is at maximum. When N is at minimum, the rate of change of P is at minimum. When the rate of change of N is at minimum, P is at maximum. Finally, when the rate of change of N is at maximum, P is at minimum. Thus, when a step input J is applied, the interdependency of N and P cause the two values to oscillate.

The gain perturbation of a semiconductor optical amplifier in dB is given by equation (3):

$$\Delta g(\omega) = 4.34 \Gamma a \Delta N \approx 4.34 \Gamma \left(\frac{A}{v_g}\right)\left(\frac{i\omega S}{AP_o}\right)(1 - \omega^2/\omega_r^2 + i\omega\gamma/\omega_r^2)^{-1} \quad (3)$$

where, $$S = P_{out}/(h\nu v_g A_{mode}) \quad (4)$$

with $A_{mod\ g}$ being the area of the optical amplifier mode, ($P_{out}$ being optical amplifier output power, α is the spatial differential gain coefficient (α=A/$v_g$), h is Planck's constant, ν is the frequency of light in cycles per second, $v_g$ is the speed of light in the material, $\omega_r$ is the relaxation oscillation frequency in radians per second, and γ is the damping coefficient in radians per second.

Also, the relaxation oscillation ($\omega_r$) and the damping coefficient (γ) are given by equations (5) and (6):

$$\omega_r^2 = AP_o/\tau_p = A \cdot \left(\frac{J - J_{th}}{e}\right) \cdot \frac{1}{L} \quad (5)$$

$$\gamma = A(P_o + S) + 1/\tau_n = \left(\frac{J - J_{th}}{e}\right) \cdot \frac{a}{\pi} \cdot \mathcal{F} + AS + \frac{1}{\tau_n} \quad (6)$$

where F is the finesse of the cavity, L is the length of the laser cavity, and the photon density and photon lifetime are given by equations (7) and (8) respectively:

$$P_o = \frac{\Gamma}{d} \cdot \left(\frac{J - J_{th}}{e}\right) \cdot \tau_p = \left(\frac{J - J_{th}}{e}\right) \cdot \left(\frac{1}{v_g}\right)\left(\frac{1}{\alpha L + |\ln R|}\right) \sim \quad (7)$$

$$\left(\frac{J - J_{th}}{e}\right) \cdot \left(\frac{1}{v_g}\right)\left(\frac{1}{1 - Re^{-\alpha L}}\right) \sim \left(\frac{J - J_{th}}{e}\right) \cdot \left(\frac{1}{\pi v_g}\right) \cdot \mathcal{F}$$

$$\tau_p = \frac{1}{v_g \alpha} \approx \frac{L}{v_g(1 - Re^{-\alpha L})} \quad (8)$$

In the above equations, d is the active region thickness, R is the geometric mean of the reflectivities of the two mirrors that form the laser cavity, and Γ~d/L where R~1 for a high finesse cavity (as in a vertical cavity laser), and the losses αL<<1.

At the relaxation oscillation frequency, the peak gain perturbation in dB is given by, $$\Delta g(\omega_r) = 4.34 \Gamma a \Delta N = 4.34 \Gamma \cdot \frac{\omega_r^2 S}{\gamma P_o v_g} \quad (9)$$

Equation (9) shows that the peak gain fluctuation is proportional to the ratio of $\omega_r^2/\gamma$ (the ratio of the relaxation oscillation frequency squared to the damping rate), so that, all else being equal, if the relaxation oscillation frequency is decreased relative to the damping rate, a reduced gain fluctuation can be achieved.

Shown below are parameters that are relevant (cf. eq. (9)) to the $\Delta g(\omega_r)$ performance with $\Delta Je = (J - Jth)/e$ for some types of semiconductor lasers. (Note that in equations (10) through (12) below, $$\frac{\Gamma}{d} \approx \frac{1}{L},$$

$$\omega_r^2 = A \cdot \Delta Je/L \quad (10)$$

$$\gamma = \Delta Je/(v_g L \alpha_{total}) + AS + \tau_n^{-1} \quad (11)$$

$$P_o = \Delta Je/(v_g L \alpha_{total}) \quad (12)$$

Using equations (10) through (12) and equation (7), we see that a relatively low relaxation oscillation frequency, $\omega_r$ and low losses will lead to a highly damped situation.

For some embodiments of an optical amplifier operating with data rates of 1–40 Gbps to function well, the ratio of $\omega_r^2/\gamma$ should be $<1\times10^{10}$ rad/sec, to achieve <−10 dB crosstalk.

A VLSOA:

One embodiment of an optical amplifier with a ratio of $\omega_r^2/\gamma < 1\times10^{10}$ rad/sec is an embodiment of a vertical lasing semiconductor optical amplifier (VLSOA). What follows is a description of such a VLSOA according to one embodiment of the invention. The VLSOA is one type of lasing semiconductor optical amplifier (LSOA). Other semiconductor optical amplifiers and other types of LSOAs, such as transverse lasing semiconductor optical amplifiers (TLSOA) or longitudinally lasing semiconductor optical amplifiers (LLSOA) also exist and their damping levels can be optimized in other embodiments of the invention.

Figure 3:
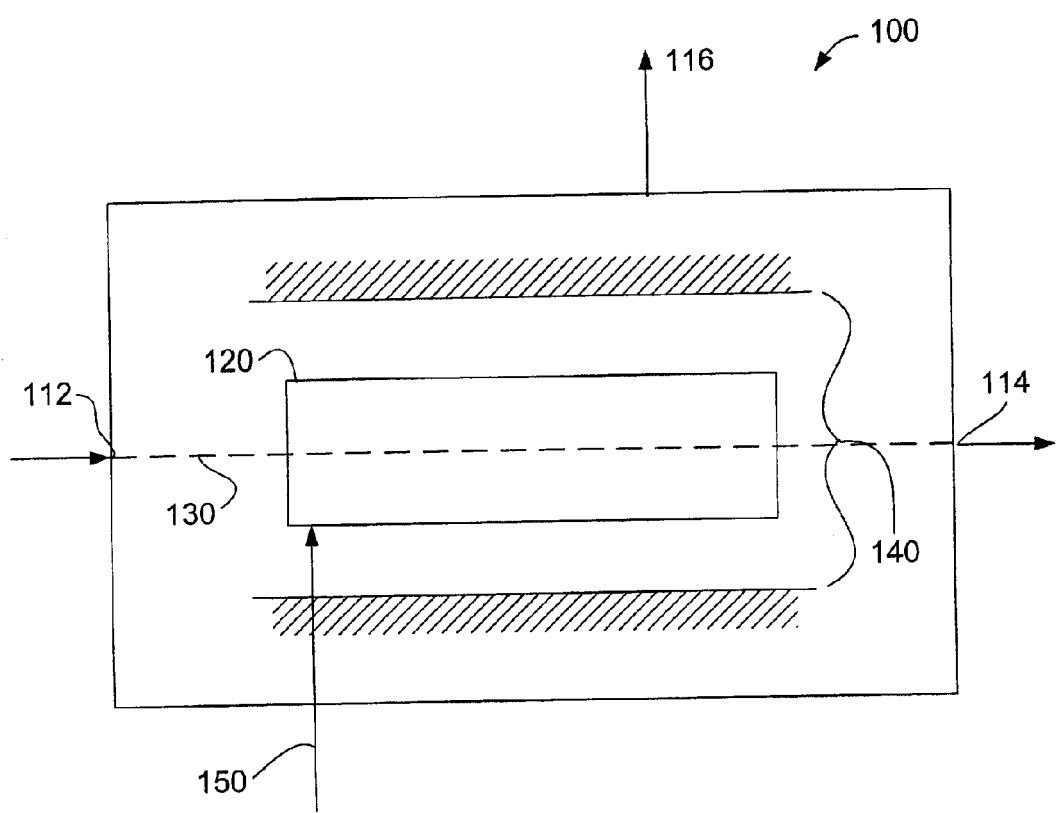
FIG. 3 is a diagram of a vertical lasing semiconductor optical amplifier (VLSOA) in accordance with the present invention.

FIG. 3 is a diagram of a VLSOA 100 in accordance with the present invention. The VLSOA 100 has an input 112 and an output 114. The VLSOA 100 further includes a semiconductor gain medium 120, with an amplifying path 130 coupled between the input 112 and the output 114 of the VLSOA 100 and traveling through the semiconductor gain medium 120. The VLSOA 100 further includes a laser cavity 140 including the semiconductor gain medium 120, and a pump input 150 coupled to the semiconductor gain medium 120. The laser cavity 140 is oriented vertically with respect to the amplifying path 130. The pump input 150 is for receiving a pump to pump the semiconductor gain medium 120 above a lasing threshold for the laser cavity 140. When pumped above threshold, the laser cavity 140 generates a laser signal, which will be referenced to as a ballast laser signal. The ballast laser signal exits the VLSOA 100 via ballast laser output 116.

Figure 4:
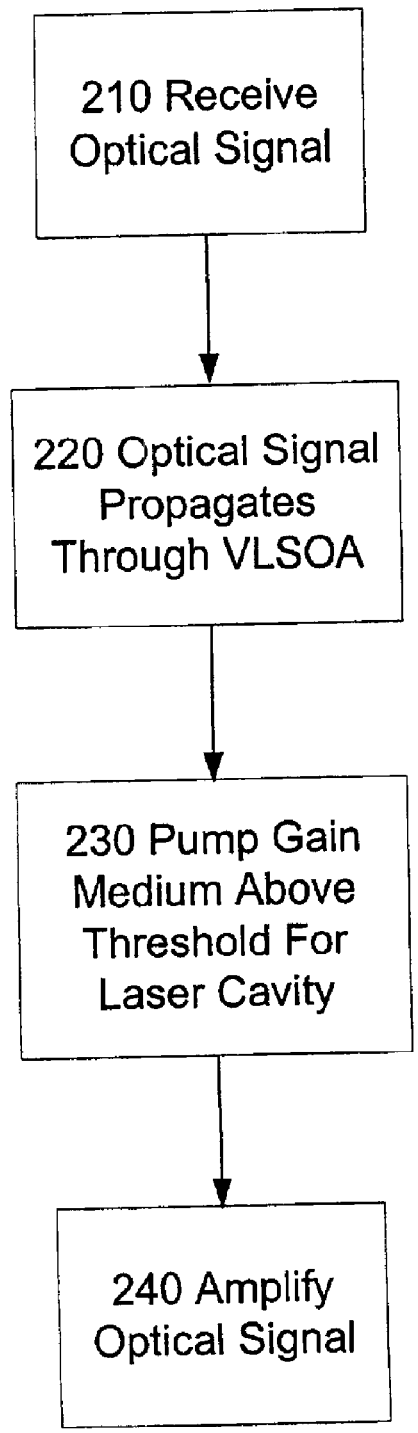
FIG. 4 is a flow diagram illustrating operation of VLSOA when it is used as an amplifier.

FIG. 4 is a flow diagram illustrating operation of VLSOA 100 when it is used as an amplifier. The VLSOA 100 receives 210 an optical signal at its input 112. The optical signal propagates 220 along the amplifying path 130. The pump signal received at pump input 150 pumps 230 the semiconductor gain medium above a lasing threshold for the laser cavity 140. When lasing occurs, the round-trip gain offsets the round-trip losses for the laser cavity 140. In other words, the gain of the semiconductor gain medium 120 is clamped to the gain value necessary to offset the round-trip losses. The optical signal is amplified 240 according to this gain value as it propagates along the amplifying path 130 (i.e., through the semiconductor gain medium 120). The amplified signal exits the VLSOA 100 via the output 114.

Note that the gain experienced by the optical signal as it propagates through the VLSOA 100 is determined in part by the gain value of the semiconductor gain medium 120 (it is also determined, for example, by the length of the amplifying path 130) and this gain value, in turn, is determined primarily by the lasing threshold for the laser cavity 140. In particular, the gain experienced by the optical signal as it propagates through each VLSOA 100 is substantially independent of the amplitude of the optical signal. This stable gain value comes about because the damping coefficient of the VLSOA is high compared to the relaxation oscillation frequency.

Figure 5A:
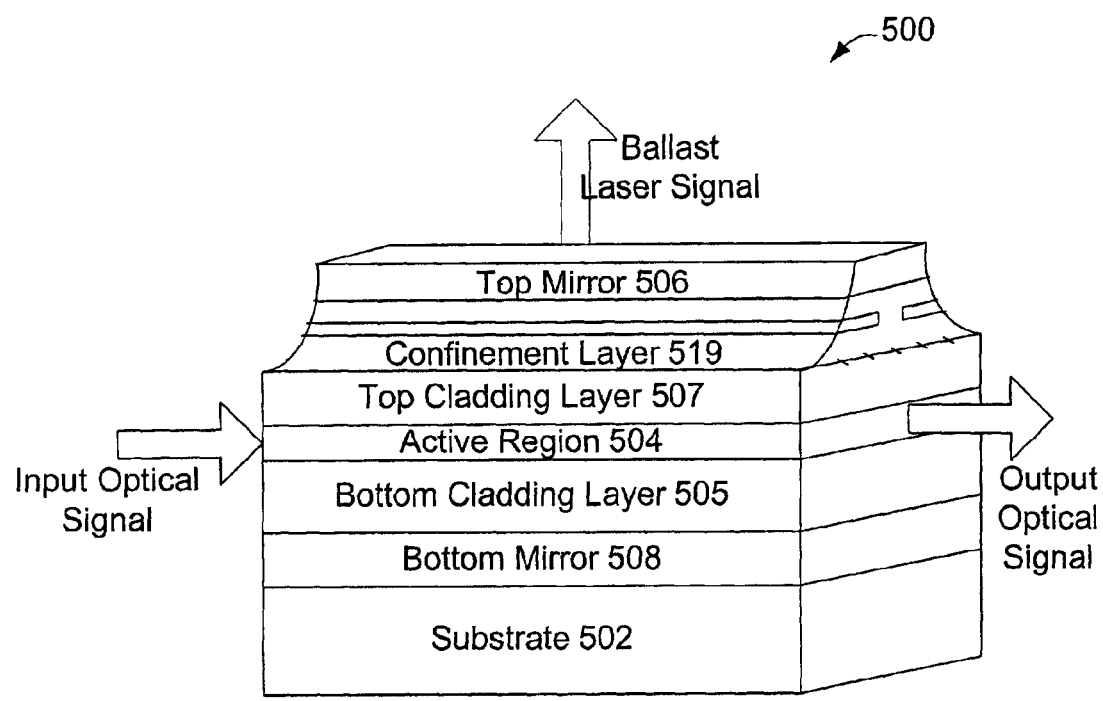
FIG. 5a is a perspective view of an embodiment of a VLSOA according to the present invention.
Figure 5B:
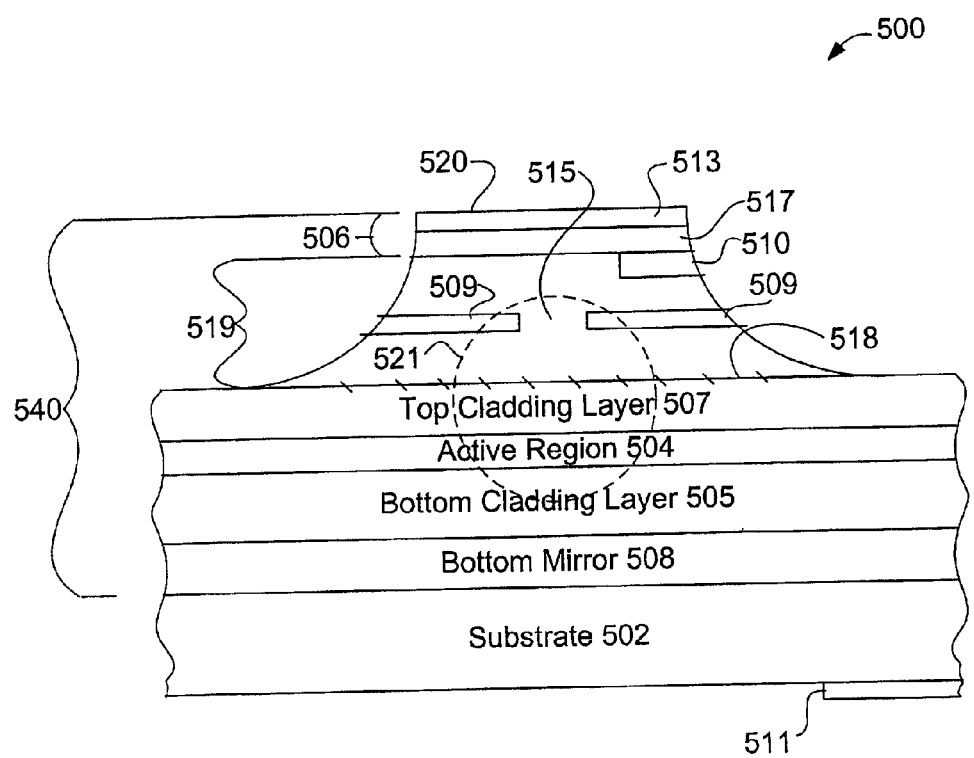
FIG. 5b is a transverse cross-section of an embodiment of a VLSOA according to the present invention.
Figure 5C:
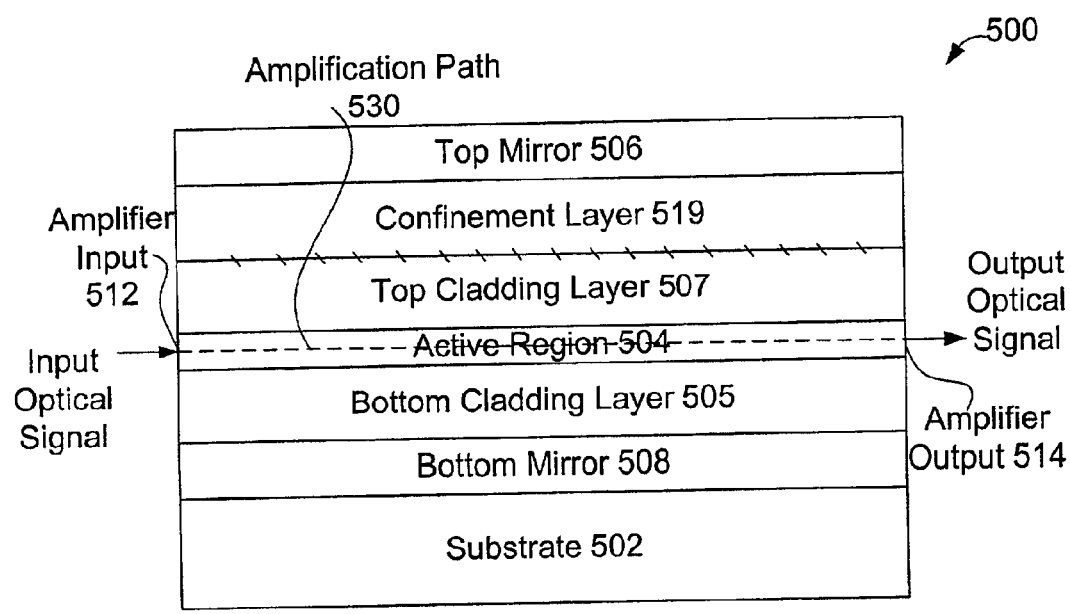
FIG. 5c is a longitudinal cross-section of an embodiment of a VLSOA according to the present invention.

FIGS. 5a–5c are a perspective view, transverse cross-section, and longitudinal cross-section, respectively, of an embodiment of a VLSOA 500 according to the present invention, with FIG. 5b showing the most detail.

Referring to FIG. 5b and working from bottom to top in the vertical direction (i.e., working away from the substrate 502), VLSOA 500 includes a bottom mirror 508, bottom cladding layer 505, active region 504, top cladding layer 507, confinement layer 519, and a top mirror 506. The bottom cladding layer 505, active region 504, top cladding layer 507, and confinement layer 519 are in electrical contact with each other and may be in direct physical contact as well. An optional delta doping layer 518 is located between the top cladding layer 507 and confinement layer 519. The confinement layer 519 includes a confinement structure 509, which forms aperture 515. The VLSOA 500 also includes an electrical contact 510 located above the confinement structure 509, and a second electrical contact 511 formed on the bottom side of substrate 502.

Comparing to FIG. 3, the semiconductor gain medium 120 includes the active region 504 and the laser cavity 140 is formed primarily by the two mirrors 506 and 508 and the active region 504. This embodiment is electrically pumped so the pump input 150 includes the electrical contacts 510, 511.

VLSOA 500 is a vertical lasing semiconductor optical amplifier since the laser cavity 540 is a vertical laser cavity. That is, it is oriented vertically with respect to the amplifying path 530 and substrate 502. The VLSOA 500 preferably is long in the longitudinal direction, allowing for a long amplifying path 530 and, therefore, more amplification. The entire VLSOA 500 is an integral structure formed on a single substrate 502 and may be integrated with other optical elements. In most cases, optical elements that are coupled directly to VLSOA 500 will be coupled to the amplifying path 530 within the VLSOA. Depending on the manner of integration, the optical input 512 and output 514 may not exist as a distinct structure or facet but may simply be the boundary between the VLSOA 500 and other optical elements. Furthermore, although this disclosure discusses the VLSOA 500 primarily as a single device, the teachings herein apply equally to arrays of devices.

VLSOA 500 is a layered structure, allowing the VLSOA 500 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

The optical signal amplified by the VLSOA 500 is confined in the vertical direction by index differences between bottom cladding 505, active region 504, and top cladding 507, and to a lesser extent by index differences between the substrate 502, bottom mirror 508, confinement layer 519, and top mirror 506. Specifically, active region 504 has the higher index and therefore acts as a waveguide core with respect to cladding layers 505, 507. The optical signal is confined in the transverse direction by index differences between the confinement structure 509 and the resulting aperture 515. Specifically, aperture 515 has a higher index of refraction than confinement structure 509. As a result, the mode of the optical signal to be amplified is generally concentrated in dashed region 521. The amplifying path 530 is through the active region 504 in the direction in/out of the plane of the paper with respect to FIG. 5.

The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In a preferred embodiment, the VLSOA 500 is optimized for the 1.55 micron window.

In one embodiment, the active region 504 includes a multiple quantum well (MQW) active region. MQW structures include several quantum wells and quantum wells have the advantage of enabling the formation of lasers with relatively low threshold currents. In alternate embodiments, the active region 504 may instead be based on a single quantum well or a double-heterostructure active region. The active region 504 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The materials for bottom and top cladding layers 505 and 507 will depend in part on the composition of active region 504.

Examples of top and bottom mirrors 506 and 508 include Bragg reflectors and other types of reflectors such as metallic mirrors. Bottom mirror 508 in FIG. 5 is shown as a Bragg reflector. Top mirror 506 is depicted as a hybrid mirror, consisting of a Bragg reflector 517 followed by a metallic mirror 513. Bragg reflectors may be fabricated using various materials systems, including for example, alternating layers of GaAs and AlAs, $SiO_2$ and $TiO_2$, InAlGaAs and InAlAs, InGaAsP and InP, AlGaAsSb and AlAsSb or GaAs and AlGaAs. Gold is one material suitable for metallic mirrors. The electrical contacts 510, 511 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 510, 511 into the active region 504. In particular, contact 510 is a p-type contact to inject holes into active region 504, and contact 511 is an n-type contact to inject electrons into active region 504. Contact 510 is located above the semiconductor structure (i.e., above confinement layer 519 and the semiconductor part of Bragg reflector 517, if any) and below the dielectric part of Bragg reflector 517, if any. For simplicity, in FIG. 5, contact 510 is shown located between the confinement layer 519 and Bragg reflector 517, which would be the case if Bragg reflector 517 were entirely dielectric. VLSOA 500 may have a number of isolated electrical contacts 510 to allow for independent pumping within the amplifier. This is advantageous because VLSOA 500 is long in the longitudinal direction and independent pumping allows, for example, different voltages to be maintained at different points along the VLSOA. Alternately, the contacts 510 may be doped to have a finite resistance or may be separated by finite resistances, rather than electrically isolated.

Confinement structure 509 is formed by wet oxidizing the confinement layer 519. The confinement structure 509 has a lower index of refraction than aperture 515. Hence, the effective cross-sectional size of laser cavity 540 is determined in part by aperture 515. In other words, the confinement structure 509 provides lateral confinement of the optical mode of laser cavity 540. In this embodiment, the confinement structure 509 also has a lower conductivity than aperture 515. Thus, pump current injected through electrical contact 510 will be channeled through aperture 515, increasing the spatial overlap with optical signal 521. In other words, the confinement structure 509 also provides electrical confinement of the pump current.

When used as an amplifier, VLSOA 500 operates as follows. Pump current is injected through contacts 510, 511, or, more precisely, holes are injected through contact 510 and electrons through contact 511. These holes and electrons flow to the active region 504, where they increase the carrier density in the active region 504. That is, the pump current is used to pump the active region 504. The pump current is laterally confined by aperture 515 and confinement structure 509. The pump current is sufficiently high to exceed a lasing threshold for vertical cavity 540. As a result, laser radiation is generated by the vertical cavity 540. This laser radiation may be emitted from the vertical cavity, for example, through the top surface 520 or into the substrate 502 or it may be generated but not actually emitted from the VLSOA 500. The laser radiation may lie in the visible, infrared, ultraviolet or other frequency range.

While the laser cavity 540 is operating above the lasing threshold, an optical signal is received at input 512 and propagates through the VLSOA 500 along amplifying path 530. As the optical signal propagates through the active region 504, the optical signal is amplified by a gain multiplier due to stimulated emission of additional photons. The gain multiplier is substantially constant (i.e., independent of the amplitude of the optical signal) because the laser radiation produced by laser cavity 540 acts as a ballast to prevent gain saturation. That is, when the optical signal is weaker, fewer additional photons are stimulated by the optical signal, but more laser radiation is generated. But when the optical signal is stronger, more additional photons are stimulated by the optical signal, but less radiation is generated. Typically, the value of the constant gain multiplier is inversely proportional to the loss of the cavity mirrors 506 and 508. For example, ignoring internal loss, if a 0.2% mirror loss (99.8% reflectivity) results in a gain of 10 dB (10 times), then a three times larger 0.6% loss (99.4% reflectivity) would result in a roughly three times larger logarithmic gain of 30 dB (1000 times) for otherwise identical VLSOAs 500. The amplified signal exits the VLSOA 500 at output 514.

Often, it is useful to combine a VLSOA with some other optical element. These combinations may be implemented as combinations of discrete devices, which are coupled together by optical fibers. Alternatively, the combinations may be implemented as integrated optics, in which many optical elements are integrated onto a common substrate.

The integration of VLSOAs with other optical elements may be implemented using any number of techniques. In one approach, both the VLSOA and the other optical element are formed using a common fabrication process on a common substrate, but with at least one parameter varying between the VLSOA and the optical element. For example, selective area epitaxy (SAE) and impurity induced disordering (IID) are two fabrication processes which may be used in this manner.

In one approach based on SAE, a nitride or oxide SAE mask is placed over selected areas of the substrate. Material is deposited on the masked substrate. The SAE mask results in a difference between the transition energy (e.g., the bandgap energy) of the material deposited on a first unmasked area of the substrate and the transition energy of the material deposited on a second unmasked area of the substrate. For example, the material deposited on the first unmasked area might form part of the active region of the VLSOA and the material deposited on the second unmasked area might form part of the core of a waveguide, with the difference in transition energy accounting for the different optical properties of the active region and the transparent core. SAE is particularly advantageous because it results in a smooth interface between optical elements and therefore reduces optical scattering at this interface, This, in turn, reduces both parasitic lasing modes and gain ripple. Furthermore, the SAE approach can be confined to only the minimum number of layers necessary (e.g., only the active region), thus minimizing the impact on the rest of the integrated optical device.

In a different approach based on IID, an IID mask is placed over selected areas of the substrate. The masked substrate is bombarded with impurities, such as silicon or zinc, and subsequently annealed to cause disordering and intermixing of the materials in the bombarded region. The IID mask results in a difference between the transition energy of the material underlying a masked area of the substrate and the transition energy of the material underlying an unmasked area of the substrate. Continuing the previous example, the masked area might form part of the VLSOA active region and the unmasked area might form part of the core of a waveguide, with the difference in transition energy again accounting for the different optical properties.

In the previous SAE and IID examples, the difference in transition energy results in different optical properties between the VLSOA active region and a waveguide. Engineering the transition energy may also be used to fabricate many other types of integrated optical devices. For example, changing the transition energy between two VLSOAs can be used to optimize each VLSOA for a different wavelength region. In this way, the transition energy in a VLSOA could be graded in a controlled way to broaden, flatten, and shape the gain profile. Alternately, two different elements, such as a VLSOA and a laser source might require different transition energies for optimal performance. Other embodiments will be apparent.

In a different approach, the VLSOA and the optical element are formed on a common substrate but using different fabrication processes. In one example, a VLSOA is formed on the common substrate in part by depositing a first set of materials on the substrate. Next, the deposited material is removed from selected areas of the substrate, for example by an etching process. A second set of materials is deposited in the selected areas to form in part the optical element. Etch and fill is one process which follows this approach. Continuing the VLSOA and waveguide example from above, materials are deposited to form the VLSOA (or at least a portion of the VLSOA). In the areas where the waveguide is to be located, these materials are removed and additional materials are deposited to form the waveguide (or at least a portion of it).

In yet another approach, the VLSOA and the optical element are formed on separate substrates by separate fabrication processes and then integrated onto a common substrate. Planar lightwave circuitry and silicon optical bench are two examples of processes following this approach. In one example, the VLSOA is formed on a first substrate. The optical element is formed on a second substrate. The VLSOA and the optical element are then integrated onto a common substrate, which could be the first substrate, the second substrate or a completely different substrate.

Figure 6:
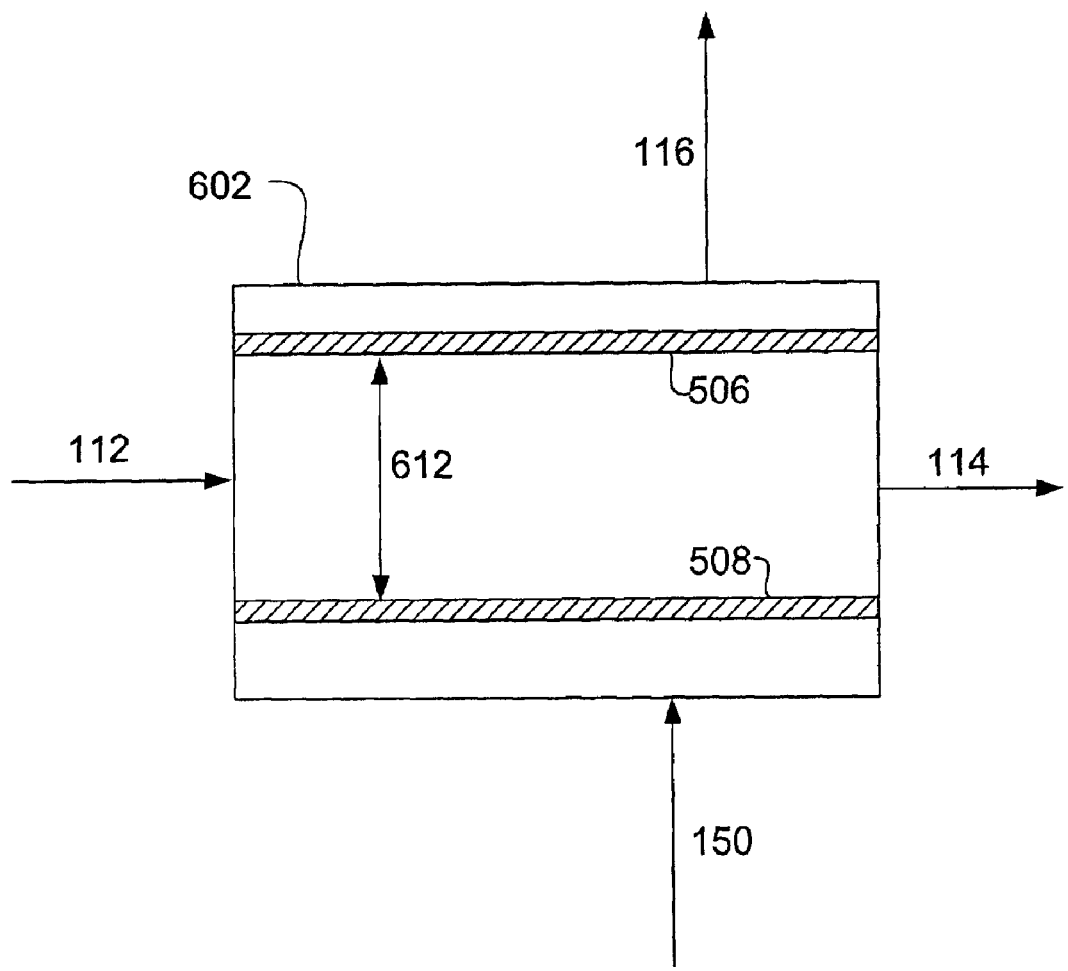
FIG. 6 is a diagram of a VLSOA with damped relaxation oscillations.

Damping In The VLSOA:

FIG. 6 is a diagram of a VLSOA 602 with damped relaxation oscillations. The VLSOA 602 has an input 112 to the amplifying path, an output 114 of the amplifying path, a pump input 150 for pumping the active region, and a laser output 116 for the laser mode of the laser cavity. The VLSOA 602 also has a top mirror 506 and a bottom mirror 508, with a distance 612 between the mirrors. In the VLSOA 602 shown in FIG. 6, the distance 612 between the mirrors has been chosen so that the relaxation oscillation frequency is damped.

The VLSOA 602 with a heavily damped relaxation oscillation frequency is similar in some ways to a conventional vertical cavity surface emitting laser (VCSEL). One of the differences between the VLSOA 602 and a VCSEL is that the distance 612 between the mirrors 506 and 508 in VLSOA 602 is larger than in a VCSEL. The distance 612 between the mirrors and the index of refraction determines an optical path length for the laser traveling within the amplifier. Typically, a VCSEL will have a distance 612 between the mirrors of one-half of the wavelength of the laser light traveling between the mirrors. In other words the distance 612 between the mirrors =$\lambda/2$, where $\lambda$ is the wavelength of the laser light in the optical amplifier. Note that the wavelength of the laser light outside the material is different than the wavelength of the laser light in the optical amplifier. The index of refraction within the optical amplifier is changes the wavelength. Thus, outside the optical amplifier, the laser light has a wavelength of approximately 1550 nanometers. However, the index of refraction of the VCSEL causes the wavelength of the light within the VCSEL to be approximately 400 to 500 nanometers. Thus, the $\lambda/2$ distance 612 in the VCSEL is approximately 200 to 250 nanometers. When the distance 612 between the mirrors is defined in terms of the wavelength of the laser, it is defined in terms of the wavelength of the laser within the optical amplifier.

The distance 612 between the mirrors in the damped VLSOA 602 is greater than $\lambda/2$. This greater distance 612 helps provide the desired ratio of $\omega_r^2/\gamma<1\times10^{10}$ rad/sec. As seen from equations (7) and (10) through (12), a combination of a long cavity length (larger distance 612) and low losses (i.e. a 5×larger photon lifetime, which is provided by good mirror reflectivity) allows the VLSOA 602 to have a relaxation oscillation frequency that is significantly damped. This means that the VLSOA 602 reduces gain fluctuations as compared to a VCSEL or other semiconductor optical amplifiers such as the class of longitudinally lasing semiconductor optical amplifiers (LLSOAs).

Typically, the distance 612 is greater than 500 nanometers. In various embodiments, the distance 612 is one micrometer, two micrometers, four micrometers, six micrometers, and greater than six micrometers. In some embodiments, defining the distance 612 (and since the index of refraction is fixed, this also defines the optical pathlength) in relation to the wavelength, the distance is greater than $\lambda$, greater than 2$\lambda$, greater than 6$\lambda$, greater than 10$\lambda$, and greater than 12$\lambda$. In one preferred embodiment, the distance 612 is within the range of approximately four to six micrometers. In a second preferred embodiment, the distance 612 is within the range of approximately 12$\lambda$ to 14$\lambda$. These distances 612 (4–6 micrometers, or 12$\lambda$ to 14$\lambda$) provide enough damping for the optical amplifier to function well with digital data passing through it at rates from 1 to 40 GHz, and with a crosstalk kept less than −10 dB for those data rates. This larger distance 612 between the mirrors 506 and 508 provides the damped relaxation oscillation. For some preferred embodiments of a VLSOA 602 having a distance 612 of approximately four to six micrometers, the relaxation oscillation frequency to damping coefficient ratio is approximately $\omega_r^2/\gamma=0.37\times10^{10}$ rad/sec.

In contrast, a conventional VCSEL or LLSOA has a relaxation oscillation frequency to damping coefficient ratio that is significantly higher. For example, in contrast to equations (10) through (12) above, the relaxation oscillation frequency and damping coefficients for a LLSOA are given in equations (13) through (15), below. (Note that in equations (13) through (15) below, $$\frac{\Gamma_{LLSOA}}{d} = \frac{1}{h_{mod\ e}},$$

for a LLSOA):

$$\omega_r^2 = A \cdot \Delta Je/h \bmod e \quad (13)$$

(hmod e=mode height)

$$\gamma = \Delta Je/(v_g h_{mod\ e} \alpha_{total}) + As + \tau_n^{-1} \quad (14)$$

$$P_o = \Delta Je/(v_g h_{mod\ e} \alpha_{total}) \quad (15)$$

For a typical LLSOA, this results in a relaxation oscillation frequency to damping coefficient ratio of approximately $\omega_r^2 = 8.1\times10^{10}$ rad/sec, which is significantly higher than the desired ratio of $\omega_r^2\gamma<1\times10^{10}$ rad/sec.

Figure 7:
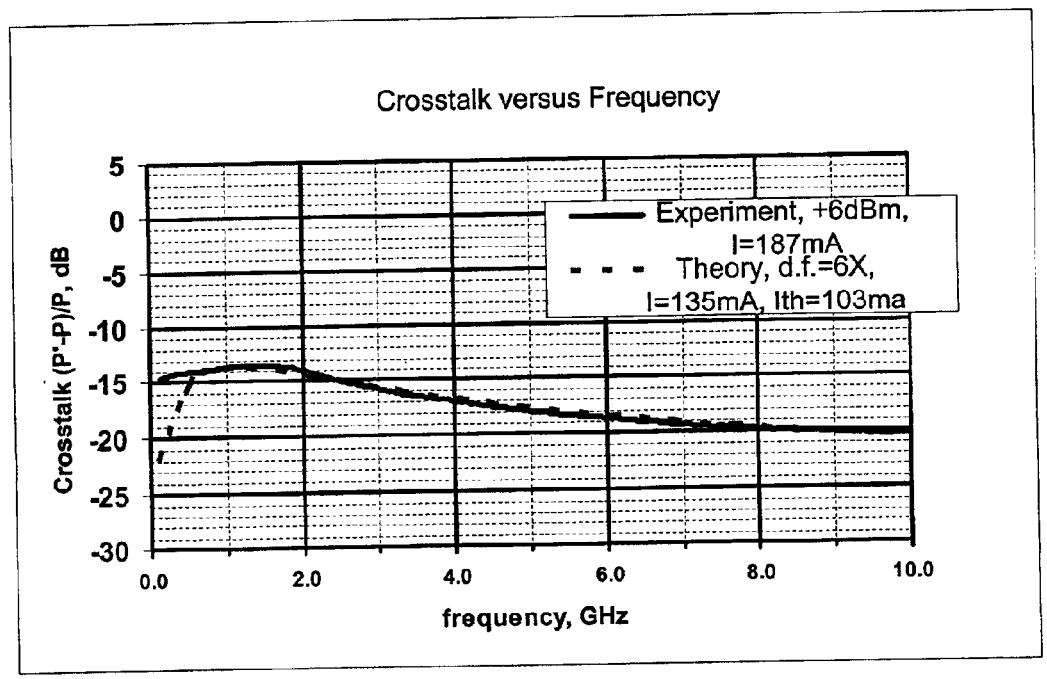
FIG. 7 is a graph that shows the theoretical and experimental performance of a VLSOA.
Figure 8:
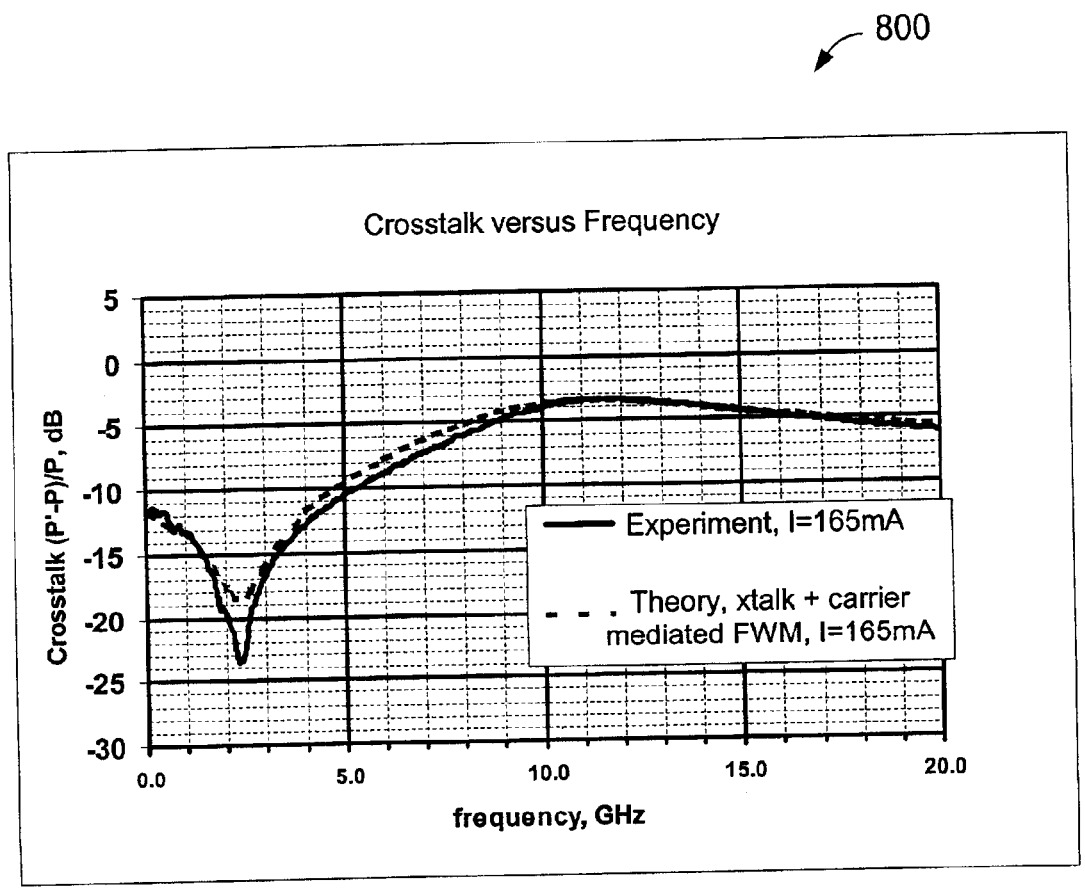
FIG. 8 is a graph that shows the theoretical and experimental performance of a LLSOA.

FIGS. 7 and 8 are graphs 700 and 800 that compare the performance of an embodiment of the VLSOA 602 with a relaxation oscillation frequency to damping coefficient ratio $\omega_r^2\gamma<1\times10^{10}$ rad/sec compared with the performance of a LLSOA with a relaxation oscillation frequency to damping coefficient ratio of approximately $\omega_r^2\gamma=8.1\times10^{10}$ rad/sec.

FIG. 7 is a graph 700 that shows the theoretical and experimental performance of a VLSOA with a large distance 612 between the mirrors. The graph 700 shows crosstalk versus relaxation oscillation frequency for VLSOA 602. As seen in FIG. 7, both the theoretical data 702 and experimental data 704 show that the crosstalk remains below −10 dB for all shown frequencies, and can be used as an optical amplifier with a wide range of data rates.

FIG. 8 is a graph 800 that shows the theoretical and experimental performance of a conventional LLSOA. The graph 800 shows crosstalk versus relaxation oscillation frequency for the conventional LLSOA. As seen in FIG. 8, both the theoretical data 802 and experimental data 804 show that the crosstalk is below −10 dB only for certain frequencies. This means that the conventional LLSOA is unsuitable for use with all shown data rates, and thus is not as versatile as the VLSOA with a large distance 612 between the mirrors.

Figure 9:
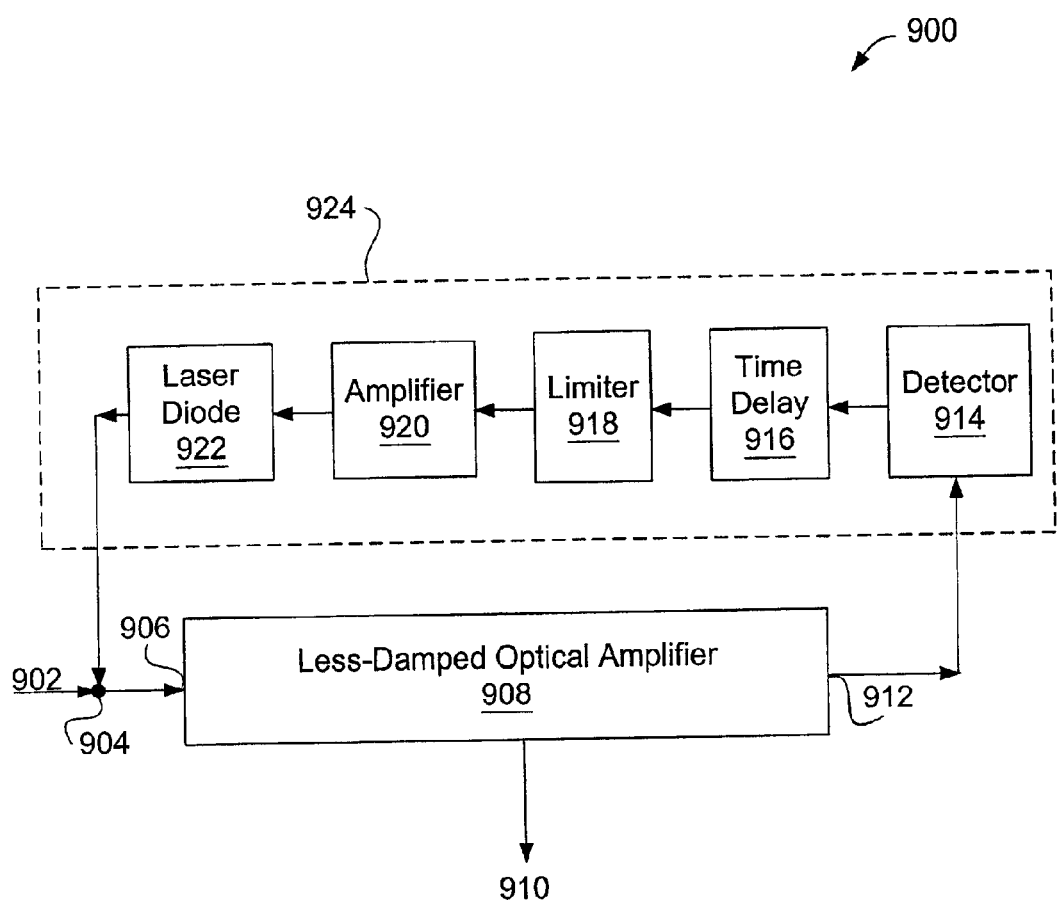
FIG. 9 is a block diagram of a second embodiment of a damped optical amplifier.

A Second Damped Optical Amplifier:

FIG. 9 is a block diagram of a second embodiment of a damped optical amplifier 900. The damped optical amplifier 900 has a system input 902 that is connected to an optical coupler 904. The optical coupler is connected to the signal input 906 of a less-damped (and lasing type) optical amplifier 908. The less-damped optical amplifier 908 has undesired relaxation oscillation similar to that illustrated in FIGS. 1 and 2. The less-damped optical amplifier 908 has an amplified signal output 910 and a laser output 912. The laser output 912 is connected to a detector 914. The detector 914 is connected to a time delay 916. The time delay 916 may be fixed or adjustable. The time delay 916 is connected to a limiter 918. The limiter 918 is connected to an amplifier 920. The amplifier 920 is connected to a laser diode 922. Note that while the illustrated embodiment uses a laser diode 922 to generate an optical signal, other embodiments use other optical signal generators. Finally, the laser diode 922 is connected to the coupler 904.

Several of the components in the damped optical amplifier 900 form a feedback loop 924 that adds damping to remove relaxation oscillation from the less-damped optical amplifier 908. FIG. 1 represents the output from the laser output 912 if the less-damped optical amplifier 912 were to operate without the other components in the damped optical amplifier 900. The feedback loop 924, which in the described embodiment includes the detector 914, the time delay 916, the limiter 918, the amplifier 920, and the laser diode 922, functions to fill in the troughs seen in the graph of FIG. 1.

In operation, the detector 914 detects the laser output 912 and, in response, generates an electrical signal that represents the laser output 912. This signal is sent to the time delay 916. The time delay 916 functions as a phase delay. The delayed signal is sent from the time delay 916 to the limiter 918. The limiter 918 acts to center the signal around zero and remove part of the signal. For example, if the limiter 918 receives a signal that is a sine wave, the limiter 918 would allow the "top half" of the signal to pass through. Thus, from zero to 180 degrees, an embodiment of a limiter 918 would output an unaltered sine wave signal, while from 180 to 360 degrees, the limiter 918 would output a zero value.

The output of the limiter 918 is sent to the amplifier 920. The amplified signal is sent from the electrical amplifier 920 to the laser diode 922. The laser diode 922 receives the electrical signal and outputs an optical feedback signal. This optical feedback signal is sent to the coupler 904 and from there is fed into the less-damped optical amplifier 908. The optical feedback signal provides damping by filling in the troughs seen in the graph of FIG. 1.

Figure 10:
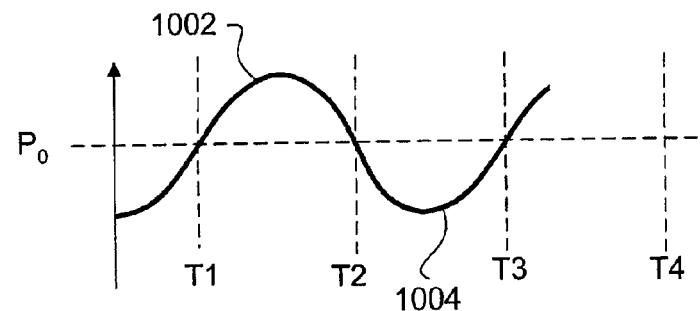
FIGS. 10 through 13 are graphs that illustrate the operation of the damped optical amplifier.
Figure 11:
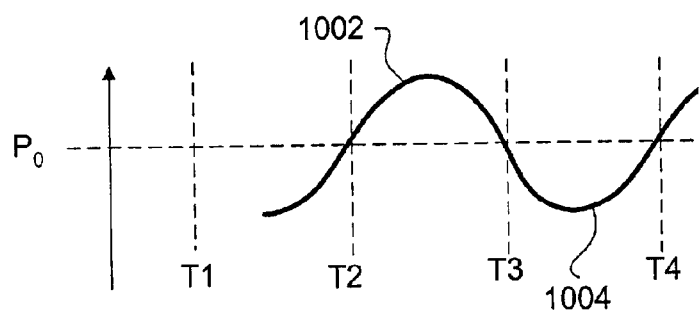
Figure 12:
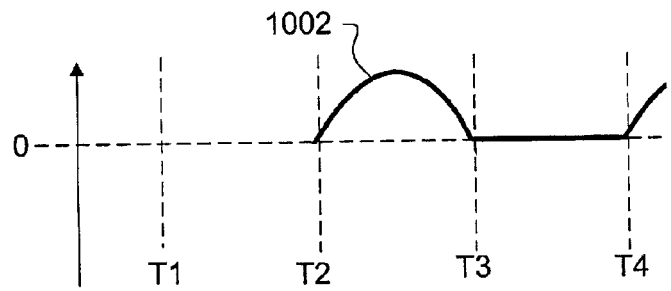

FIGS. 10 through 13 are graphs that illustrate the operation of the damped optical amplifier 900. FIG. 10 is a graph of the laser output 912 of the less-damped optical amplifier 908. It shows the oscillation similar to that shown in FIG. 1, and includes a "hill" 1002 that extends from time T1 to time T2 as well as a "tough" 1004 that extends from time T2 to time T3. The signal represented by the graph in FIG. 10 is detected by detector 914 and sent to the time delay 916. The time delay 916 shifts the phase of the signal, as shown in the graph of FIG. 11, so that the "hill" 1002 now extends from time T2 to time T3 and the "trough" 1004 extends from time T3 to time T4. The phase shifted signal shown in FIG. 11 is sent to the limiter 918. The limiter 918 filters out the lower part of the signal (the "trough" 1004). As shown in FIG. 12, the "hill" 1002 remains, but the "trough" 1004 has been removed by the limiter 918. This signal is sent from the limiter 918 to the amplifier 920, and then to the laser diode 922, which outputs an optical signal that corresponds to the signal shown in FIG. 12. This optical signal is sent to the less-damped optical amplifier 908 via the coupler 904. The signal shown in FIG. 12 is combined with the signal shown in FIG. 10.

Figure 13:
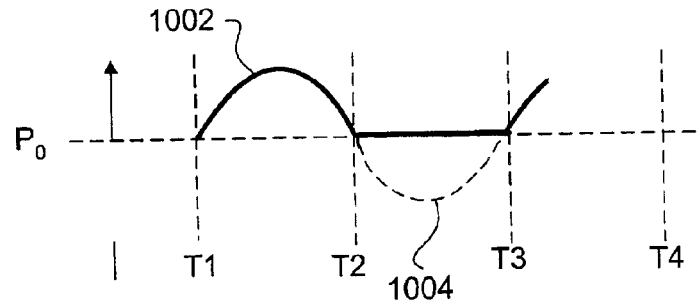

The resulting combined signal is shown in FIG. 13. As seen in FIG. 13, the phase-delayed "hill" 1002 from the feedback loop in combination with the "trough" 1004 from the original signal shown in FIG. 10 has canceled out the "trough" 1004. The dashed lines indicate where the "trough" 1004 would have been. The "trough" 1004 has been canceled out by the phase-delayed "hill" 1002 from the feedback loop 924. Since the carrier density is coupled to the photon density, as described above in equations (1) and (2) and with respect to FIGS. 1 and 2, removing oscillations from the photon density also acts to remove oscillations from the carrier density. Thus, the feedback loop 924 acts to damp out the relaxation oscillations in the damped optical amplifier 900.

The Less-Damped Optical Amplifier:

In one embodiment of the damped optical amplifier 900, the less-damped optical amplifier 908 is a VLSOA 100 that lacks sufficient damping. The feedback loop 924 shown in FIG. 9 is capable of adding damping to a VLSOA 100. In such an embodiment, the signal input 906 of the less-damped optical amplifier 908 is the input 112 of the VLSOA 100, the laser output 912 of the less-damped optical amplifier 908 is the laser output 116 of the VLSOA 100, and the amplified signal output 910 is the output 114 of the VLSOA 100. However, the feedback loop 924 may be used to provide other optical amplifiers with increased relaxation oscillation as well.

Although the invention has been particularly shown and described with reference to multiple embodiments, it will be understood by persons skilled in the relevant art that various changes in form and details can be made therein without departing from the spirit and scope of the invention. For example, the invention is not limited to the VLSOA described. The damping of other types of optical amplifiers may also be optimized to reduce gain perturbation.

We claim:

1. An optical amplifier, comprising:
   an input for inputting an optical signal that is to be amplified;
   a gain medium having an amplifying path traversing the gain medium and coupled to the input for amplifying the optical signal to create an amplified optical signal;
   an output coupled to the gain medium for outputting the amplified optical signal;
   a laser cavity, oriented vertically with respect to the amplifying path;
   a pump input coupled to the gain medium for receiving a pump to pump the gain medium to a predetermined lasing threshold; and
   wherein the optical amplifier has a ratio of a relaxation oscillation frequency squared to damping coefficient of less than $1 \times 10^{10}$ rad/sec.

2. The optical amplifier of claim 1, wherein the ratio of a relaxation oscillation frequency squared to damping coefficient is less than $0.5 \times 10^{10}$ rad/sec.

3. The optical amplifier of claim 1, wherein the ratio of a relaxation oscillation frequency squared to damping coefficient is approximately $0.37 \times 10^{10}$ rad/sec.

4. A system for providing optical amplification with damped relaxation oscillation, comprising:
   a system input;
   an optical coupler having a first input connected to the optical coupler output, a signal output, and a laser output;
   a feedback loop having an input connected to the optical amplifier laser output and an output connected to the second input of the optical coupler, the feedback loop including:
      a detector connected to the optical amplifier laser output for detecting the laser output and, in response, generating a signal representing the laser output;
   a time delay connected to the detector for delaying the signal representing the laser output; and an optical signal generator connected to the adjustable time delay for generating an optical signal; and wherein the feedback loop provides a feedback signal for damping a relaxation oscillation of the optical amplifier.

5. The system of claim 4, wherein the feedback loop further comprises:

a limiter connected to the time delay for limiting the delayed signal;

an amplifier connected to the limiter for amplifying the delayed limited signal; and wherein the optical signal generator is connected to the adjustable time delay via the limiter and the amplifier.

6. The system of claim 4, wherein the optical amplifier is a vertical lasing semiconductor optical amplifier.

7. The system of claim 4, wherein the optical amplifier is a vertical cavity surface emitting laser.

8. The system or claim 4, wherein the optical amplifier is a longitudinally lasing semiconductor optical amplifier.

9. An optical amplifier with a damped relaxation oscillation, comprising:

a signal input for receiving a signal;

a gain medium connected to the signal input;

an amplifying path traversing the gain medium;

a first reflector and a second reflector defining a laser cavity including the gain medium, the laser cavity oriented vertically with respect to the amplifying path;

a pump input connected to the gain medium to pump the gain medium above a lasing threshold for the laser cavity and generate a laser;

a laser output connected to the laser cavity for outputting the laser;

a signal output connected to the amplifying path for outputting an amplified signal;

wherein the distance between the first reflector and the second reflector is greater than the wavelength of the laser within the laser cavity; and wherein the optical amplifier has a ratio of a relaxation oscillation frequency squared to damping coefficient of less than $1\times10^{10}$ rad/sec.

10. The optical amplifier of claim 9, wherein the distance between the first reflector and the second reflector is greater than twice the wavelength of the laser within the laser cavity.

11. The optical amplifier of claim 9, wherein the distance between the first reflector and the second reflector is greater than four times the wavelength of the laser within the laser cavity.

12. The optical amplifier of claim 9, wherein the distance between the first reflector and the second reflector is greater than six times the wavelength of the laser within the laser cavity.

13. The optical amplifier of claim 9, wherein the distance between the first reflector and the second reflector is within the range of approximately four to six times the wavelength of the laser within the laser cavity.

14. The optical amplifier of claim 9, wherein the optical amplifier is a semiconductor optical amplifier.

15. The optical amplifier of claim 14, wherein the optical amplifier is a vertical lasing semiconductor optical amplifier.

16. An optical amplifier with a damped relaxation oscillation, comprising:

a signal input for receiving a signal;

a gain medium connected to the signal input;

an amplifying path traversing the gain medium;

a first reflector and a second reflector defining a laser cavity including the gain medium, the laser cavity oriented vertically with respect to the amplifying path;

a pump input connected to the gain medium to pump the gain medium above a lasing threshold for the laser cavity and generate a laser;

a laser output connected to the laser cavity for outputting the laser;

a signal output connected to the amplifying path for outputting an amplified signal;

wherein the distance between the first reflector and the second reflector is greater than 500 nanometers; and wherein the optical amplifier has a ratio of a relaxation oscillation frequency squared to damping coefficient of less than $1\times10^{10}$ rad/sec.

17. The optical amplifier of claim 16, wherein the distance between the first reflector and the second reflector is greater than one micrometer.

18. The optical amplifier of claim 16, wherein the distance between the first reflector and the second reflector is greater than two micrometers.

19. Tho optical amplifier of claim 16, wherein the distance between the first reflector end the second reflector is greater than four micrometers.

20. The optical amplifier of claim 16, wherein the distance between the first reflector and the second reflector is greater than six micrometers.

21. The optical amplifier of claim 16, wherein the distance between the first reflector and the second reflector is within the range of approximately four to six micrometers.

22. The optical amplifier of claim 16, wherein the optical amplifier is a semiconductor optical amplifier.

* * * * *

UNITED STATES PATENT AND TRADEMARK OFFICE
CERTIFICATE OF CORRECTION

PATENT NO. : 6,943,939 B1
APPLICATION NO. : 10/101761
DATED : September 13, 2005
INVENTOR(S) : DiJaili et al.

It is certified that error appears in the above-identified patent and that said Letters Patent is hereby corrected as shown below:

Cover Page
Item [56], Page 2, left column, "Pleumeekers et al...", change "Applicaiotns" to --Applications--
Item [56], Page 2, right column, "McAdams...", change "R,T.," to --R.T.,--
Item [56], Page 3, left column, "Yoshimoto, N..." change "Magarl" to --Magari--

Column 3
Line 2, after "photon" insert --lifetime,--
Line 49, change "$A_{mod\,g}$" to --$A_{mode}$--
Line 50, change "α" to -- $a$ --
Line 51, change "( α=A/$v_g$)" to --( $a$ = A/$v_g$)--
Line 65, change "F" to -- $F$ --

Column 4
Line 29, change "ΔJe=(J-Jth)/e" to -- $\Delta Je = (J - J_{th})/e$ --

Column 6
Line 29, change "FIG. 5" to --FIG. 5b--
Line 57, change "FIG. 5" to --FIG. 5b--

Column 7
Line 8, change "FIG. 5" to --FIG. 5b--

Column 9
Line 32, change "determines" to --determine--
Line 40, after "amplifier" remove "is"

Column 10
Line 28, change "$\omega_r^2$=A·Δ $Je/h$ mod $e$" to -- $\omega_r^2$=A·Δ $Je/h_{mode}$ --
Line 30, "(hmod e=mode height)" to --$h_{mode}$=mode height--
Line 37, change " $\omega_r^2$=8.1x10$^{10}$ " to -- $\omega_r^2/\gamma$=8.1x10$^{10}$ --
Line 38, change " $\omega_r^2\gamma$<1x10$^{10}$ " to -- $\omega_r^2/\gamma$<1x10$^{10}$ --
Line 42, change " $\omega_r^2\gamma$<1x10$^{10}$ " to -- $\omega_r^2/\gamma$<1x10$^{10}$ --
Line 44, change " $\omega_r^2\gamma$=8.1x10$^{10}$ " to -- $\omega_r^2/\gamma$=8.1x10$^{10}$ --
Line 48, remove "702"
Line 49, remove "704"
Line 56, remove "802"
Line 56, remove "804"

UNITED STATES PATENT AND TRADEMARK OFFICE
CERTIFICATE OF CORRECTION

PATENT NO. : 6,943,939 B1
APPLICATION NO. : 10/101761
DATED : September 13, 2005
INVENTOR(S) : DiJaili et al.

It is certified that error appears in the above-identified patent and that said Letters Patent is hereby corrected as shown below:

Column 12
Line 54, change "comprising." to --comprising:--

Column 14
Line 40, change "end" to --and--

Signed and Sealed this

Eighteenth Day of December, 2007

JON W. DUDAS
*Director of the United States Patent and Trademark Office*